DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JUNE 5, 1973

911 O.G. 7

T911,004
LITHOGRAPHIC PRINTING PLATE
James F. McKague, Kodak Park, Rochester, N.Y. 14650
Filed Apr. 20, 1972, Ser. No. 246,014
Int. Cl. G03f *7/02*
U.S. Cl. 96—86
No Drawing. 20 Pages Specification

A lithographic printing plate comprises an aluminum surface coated with a coating of chromium phosphate and having thereon an image-forming layer which can be a radiation sensitive layer or a silver precipitating layer. The aluminum is typically immersed in an aqueous solution of chromium oxide, phosphoric acid and sodium fluoride. An image can be obtained on the plate by diffusion transfer after which the plate is treated with an oleophilic compound to improve the ink water differential or the image may be formed using a light sensitive coating such as a silver halide emulsion, diazo resin, etc.